(12) United States Patent
Vasiliu

(10) Patent No.: US 7,561,456 B2
(45) Date of Patent: Jul. 14, 2009

(54) MEMORY ARRAY INCLUDING PROGRAMMABLE POLY FUSES

(75) Inventor: Laurentiu Vasiliu, San Diego, CA (US)

(73) Assignee: Broadcom Corporation, Irvine, CA (US)

( * ) Notice: Subject to any disclaimer, the term of this patent is extended or adjusted under 35 U.S.C. 154(b) by 64 days.

(21) Appl. No.: 11/807,974

(22) Filed: May 30, 2007

(65) Prior Publication Data

US 2008/0298112 A1    Dec. 4, 2008

(51) Int. Cl.
    *G11C 17/00*    (2006.01)
(52) U.S. Cl. .................. 365/96; 365/94; 365/225.7
(58) Field of Classification Search .............. 365/94, 365/96, 225.7
    See application file for complete search history.

(56) References Cited

U.S. PATENT DOCUMENTS 5,789,970 A * 8/1998 Denham ................ 327/525
6,933,591 B1 * 8/2005 Sidhu et al. ............ 257/665
7,227,207 B2 * 6/2007 Park et al. .............. 257/292
2006/0071298 A1 * 4/2006 Hui et al. ................ 257/544

* cited by examiner

*Primary Examiner*—Hoai V Ho
(74) *Attorney, Agent, or Firm*—Farjami & Farjami LLP

(57) ABSTRACT

According to one exemplary embodiment, a memory array includes a memory cell having a programmable poly fuse coupled between a designated program node and a ground node, where the programmable poly fuse includes a P type resistive poly segment forming a P-N junction with an adjacent N type resistive poly segment. In the programmable poly fuse, the P type resistive poly segment is coupled to the ground node and the N type resistive poly segment is coupled to the designated program node. The programmable poly fuse further includes a P side silicided poly line contiguous with the P type resistive poly segment and coupled to the ground node. The programmable poly fuse further includes an N side silicided poly line contiguous with the N type resistive poly segment and coupled to the designated program node.

17 Claims, 6 Drawing Sheets

US 7,561,456 B2

MEMORY ARRAY INCLUDING PROGRAMMABLE POLY FUSES

BACKGROUND OF THE INVENTION

1. Field of the Invention

The present invention is generally in the field of semiconductors. More particularly, the invention is in the field of semiconductor memory arrays.

2. Background Art

A memory array, such as a programmable read-only memory (ROM) array, can include a number of memory cells, where each memory cell includes a fuse that can be electrically blown to program the memory cell. During programming of each memory cell in the array, a programming voltage, which is typically provided by a charge pump, can be applied to the fuse via a programming device so as to cause the fuse to break down. However, the level of the programming voltage required to break down a conventional fuse, such as a conventional polysilicon (poly) gate fuse, can undesirably increase leakage current in the memory array.

A conventional fuse, such as a conventional poly gate fuse, can include a gate oxide layer underlying a poly gate. During memory cell programming, a high voltage can be applied to the poly gate to cause the gate oxide layer to break down, thereby shorting the gate to the substrate. However, the level of high voltage required to cause the gate oxide layer to breakdown can increase leakage current in high voltage charge pumps and programming devices in the memory array, which can undesirably limit the size of the array. Also, as a result of temperature and voltage stresses, the resistance of the gate oxide layer in a conventional fuse, such as a conventional poly gate fuse, can change after the memory cell has been programmed. As a result, a memory cell utilizing conventional fuses, such as conventional poly gate fuses, can change logic states after being programmed, thereby undesirably reducing memory array reliability.

SUMMARY OF THE INVENTION

A memory array including programmable poly fuses substantially as shown in and/or described in connection with at least one of the figures, as set forth more completely in the claims.

DETAILED DESCRIPTION OF THE INVENTION

The present invention is directed to a memory array including programmable poly fuses. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
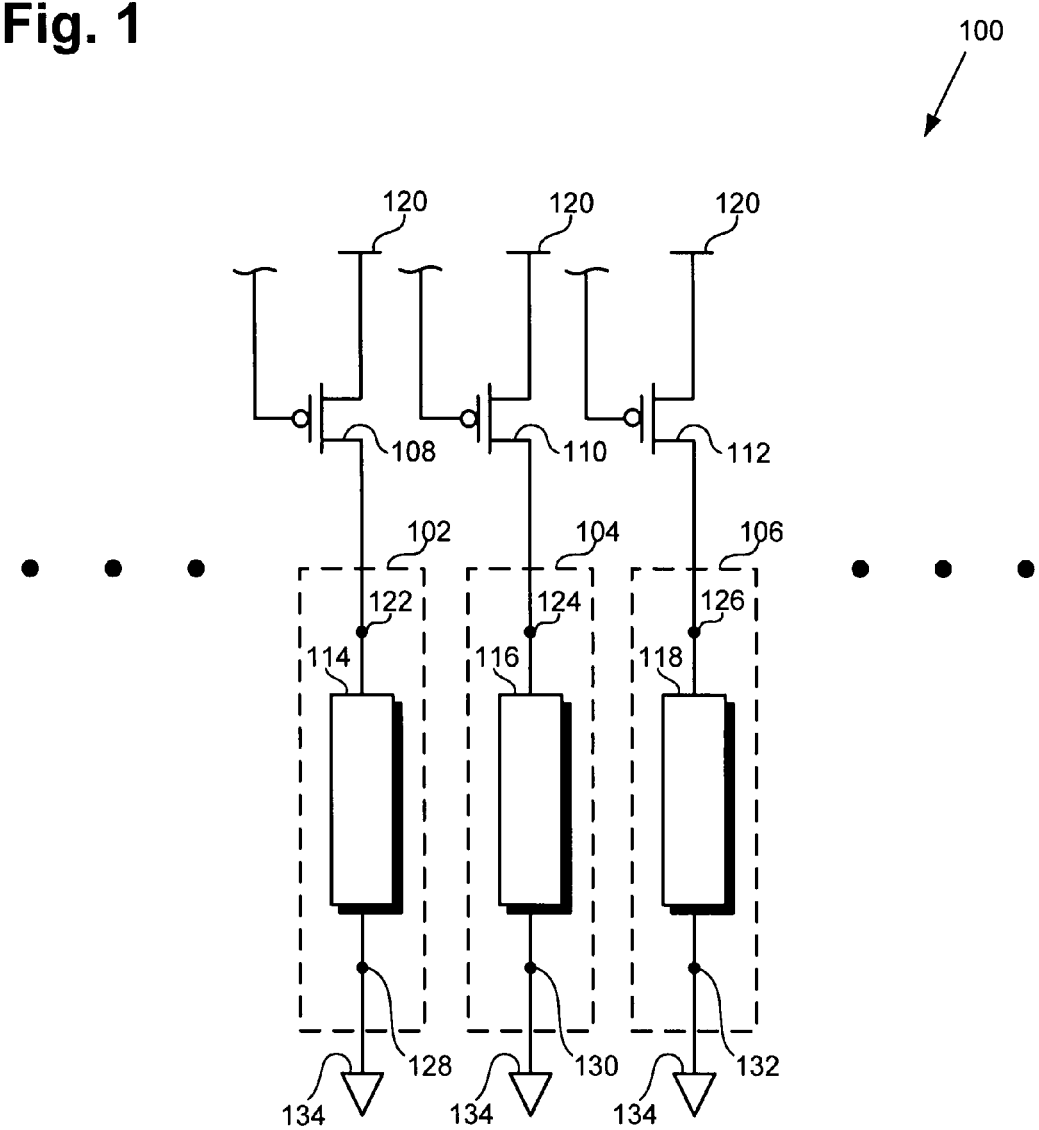
FIG. 1 illustrates a circuit diagram of an exemplary memory array including exemplary programmable poly fuses in accordance with one embodiment of the present invention.

FIG. 1 shows a circuit diagram of memory array 100 in accordance with one embodiment of the present invention. Memory array 100 includes memory cells 102, 104, 106, and programming devices 108, 110, and 112. Memory cell 102 includes programmable poly (polysilicon) fuse 114 (also referred to simply as "poly fuse 114"), memory cell 104 includes programmable poly fuse 116 (also referred to simply as "poly fuse 116"), and memory cell 106 includes programmable poly fuse 118 (also referred to simply as "poly fuse 118"). Memory array 100 can be, for example, a programmable ROM (read-only memory) array. Memory array 100 also includes wordline, bitlines, and other circuitry, which are not shown in FIG. 1 so as not to obscure the invention.

As shown in FIG. 1, the sources of programming devices 108, 110, and 112 are coupled to programming voltage 120 and the drains of programming devices 108, 110, and 112 are coupled to programming nodes 122, 124, and 126 of memory cells 102, 104, and 106, respectively. Programming voltage 120 is a high voltage that can be utilized to program memory cells, such as memory cells 102, 104, and 106, in memory array 100. Programming voltage 120 can be, for example, higher than approximately 3.5 volts, and can be generated by a charge pump (not shown in FIG. 1) in memory array 100. In the present embodiment, programming devices 108, 110, and 112 can each be a P channel field effect transistor (PFET). In other embodiments, a transistor other than a PFET or other type of semiconductor device may be utilized for programming devices 108, 110, and 112.

In the present embodiment, programming devices 108, 110, and 112 coupled to respective program nodes 122, 124, and 126 of memory cells 102, 104, and 106. In another embodiment, two or more memory cells may share a programming device, i.e., a single programming device may be coupled to two or more program nodes of respective memory cells. Programming devices 108, 110, and 112 can each be configured to selectably provide programming voltage 120 to designated program nodes, i.e., program nodes 122, 124, and 126, of respective memory cells, i.e., memory cells 102, 104, and 106, to program the memory cells. Also shown in FIG. 1, poly fuse 114 is coupled between program node 122 and ground node 128 in memory cell 102, poly fuse 116 is coupled between program node 124 and ground node 130 in memory cell 104, poly fuse 118 is coupled between program node 126 and ground node 132 in memory cell 104, and ground nodes 128, 130, and 132 are coupled to ground 134.

Poly fuses 114, 116, and 118 can each include a P type resistive poly segment forming a P-N junction with an adjacent N type resistive poly segment, a P side silicided poly line contiguous with the P type resistive poly segment and coupled to a ground node of a corresponding memory cell, and an N side silicided poly line contiguous with the N type resistive poly segment and coupled to a program node of the memory cell. Poly fuses 114, 116, and 118 are further discussed below in relation to FIGS. 2A and 2B. It is noted that memory cells 102, 104, and 106 can each include one or more additional devices and elements, which are not shown in FIG. 1 so as not to obscure the invention.

Figure 2A:
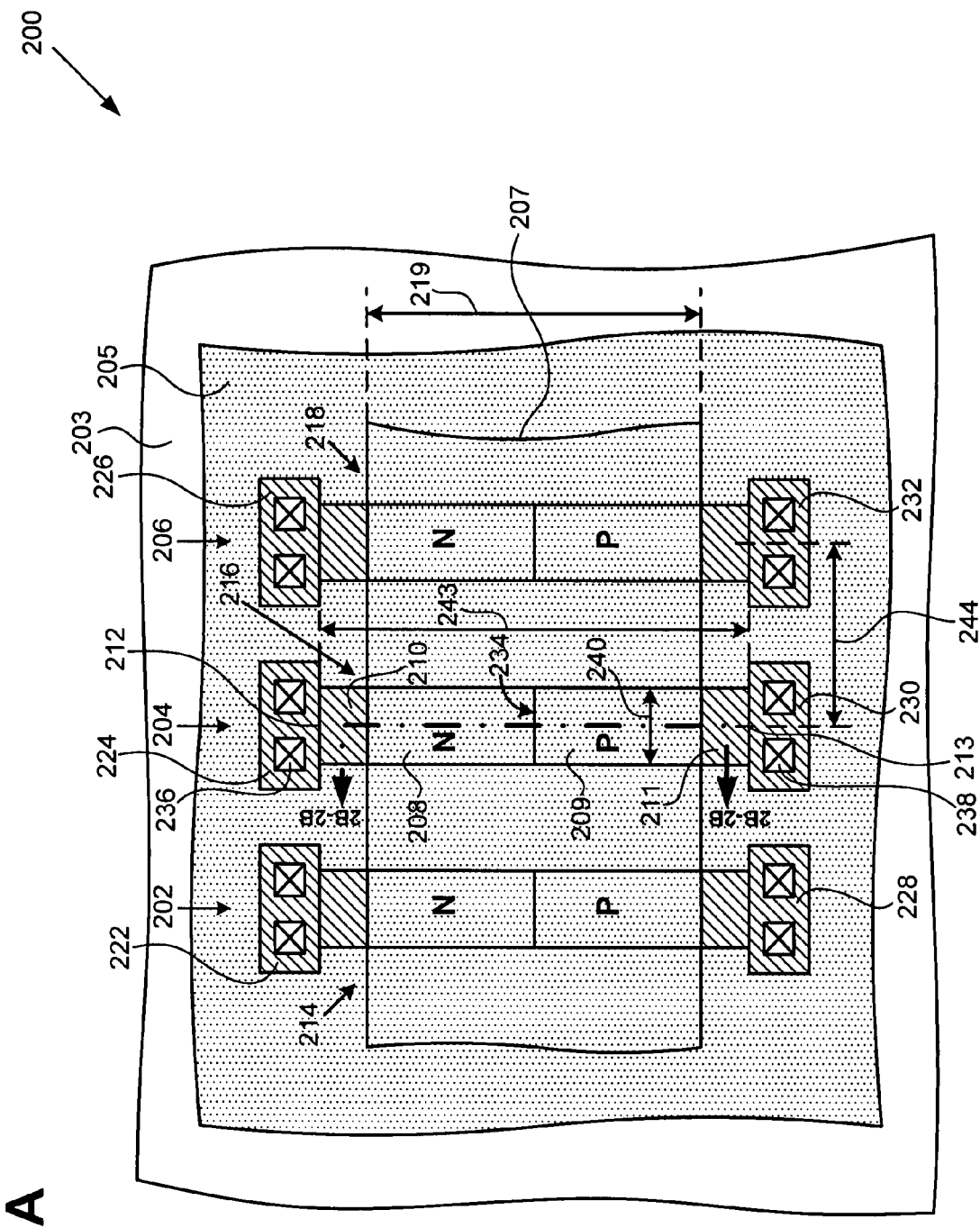
FIG. 2A illustrates a top view of an exemplary structure including exemplary programmable poly fuses in accordance with one embodiment of the present invention.

FIG. 2A shows a top view of structure 200 in accordance with one embodiment of the present invention. In FIG. 2A, memory cells 202, 204, and 206, programmable poly fuses 214, 216, and 218 (also referred to simply as "poly fuses 214, 216, and 218"), program nodes 222, 224, and 226, and ground nodes 228, 230, and 232 correspond, respectively, to memory cells 102, 104, and 106, poly fuses 114, 116, and 118, program nodes 122, 124, and 126, and ground nodes 128, 130, and 132 in memory array 100 in FIG. 1. Structure 200 includes memory cells 202, 204, and 206, substrate 203, dielectric region 205, silicide blocking layer 207, poly fuses 214, 216, and 218, program nodes 222, 224, and 226, and ground nodes 228, 230, and 232. Poly fuses 214, 216, and 218 each include N type resistive poly segment 208, P type resistive poly segment 209, N side silicided poly line 210, P side silicided poly line 211, N side terminal 212, and P side terminal 213. Structure 200 can be a portion of a semiconductor die that includes memory array 100 in FIG. 1.

As shown in FIG. 2A, poly fuses 214, 216, and 218 are situated over dielectric region 205, which is situated on substrate 203. Dielectric region 205 electrically isolates poly fuses 214, 216, and 218 from substrate 203 and can comprise silicon oxide or other suitable dielectric material. In the present embodiment, dielectric region 205 can be a shallow trench isolation (STI) region. In one embodiment, dielectric region 205 can be field oxide region. Also shown in FIG. 2A, P type resistive poly segment 209 is situated adjacent to N type resistive poly segment 208, which are situated over dielectric region 205 and under silicide blocking layer 207. P type resistive poly segment 209 can comprise heavily doped P type polysilicon and can have a resistance of, for example, approximately 700 ohms per square. P type resistive poly segment 209 can be doped with Boron or other suitable P type dopant. N type resistive poly segment 208 can comprise heavily doped N type polysilicon and can have a resistance of, for example, approximately 300 ohms per square. N type resistive poly segment 208 can be doped with Arsenic, Phosphorus or other suitable N type dopant.

Silicide blocking layer 207, which will block the silicide material (for example Cobalt or Nickel) and has width 219, is situated over to N type and P type resistive poly segments 208 and 209 in poly fuses 214, 216, and 218 so as to prevent silicide from forming on the poly segments. As a result, a P-N junction, i.e., a diode, is formed at interface 234, i.e., the boundary between P type resistive poly segment 209 and N type resistive poly segment 208. Further shown in FIG. 2A, N side silicided poly line 210 is contiguous with N type resistive poly segment 208 and coupled to program node 224 of memory cell 204. The end of N side silicided poly line 210 situated adjacent to program node 224 forms N side terminal 212 of poly fuse 216. N side silicided poly line 210 can comprise a silicide layer overlying a line of heavily doped N type polysilicon. Program node 224 can comprise a silicide segment overlying a segment of heavily doped N type polysilicon.

Also shown in FIG. 2A, P side silicided poly line 211 is contiguous with P type resistive poly segment 209 and coupled to ground node 230 of memory cell 204. The end of P side silicided poly line 211 situated adjacent to ground node 230 forms P side terminal 213 of poly fuse 216. P side silicided poly line 211 can comprise a silicide segment overlying a line of heavily doped P type polysilicon. Ground node 230 can comprise a silicide segment overlying a segment of heavily doped P type polysilicon. Further shown in FIG. 2A, program node 224 and ground node 230 can each be connected to one or more metal contacts, such as respective metal contacts 236 and 238. However, as is manifestly appreciated by one of ordinary skill in the art, program node 224 and ground node 230 can each also be connected to a metal-filled via or other suitable type of conductive material.

Further shown in FIG. 2A, poly fuses 214, 216, and 218 have width 240 and length 242. Width 240 and length 242 of poly fuses 214, 216, and 218 and width 219 of silicide blocking layer 207 can be selected to achieve a desired resistance of the poly fuse. By utilizing polysilicon with a higher resistance, length 242 of poly fuses 214, 216, and 218 can be reduced, which can correspondingly reduce the size of memory cells 202, 204, and 206. Also shown in FIG. 2A, pitch 244 represents the distance between centerlines of adjacent poly fuses, e.g., the distance between centerlines of poly fuses 216 and 218. Poly fuses 214, 216, and 218 do not generate significant substrate current when their P-N junctions are broken down during memory cell programming. As a result, poly fuses 214, 216, and 218 do not require a guard ring to prevent substrate currents generated during cell programming from interfering with adjacent memory cells, as required by a conventional poly gate fuse. Consequently, poly fuses in the invention's memory array can be more closely packed, i.e., have a smaller pitch, compared to conventional poly gate fuses in a conventional memory array. As a result, the present invention can advantageously achieve a memory array, such as a programmable ROM array, that has higher memory cell density compared to a conventional memory array utilizing conventional poly gate fuses.

Figure 2B:
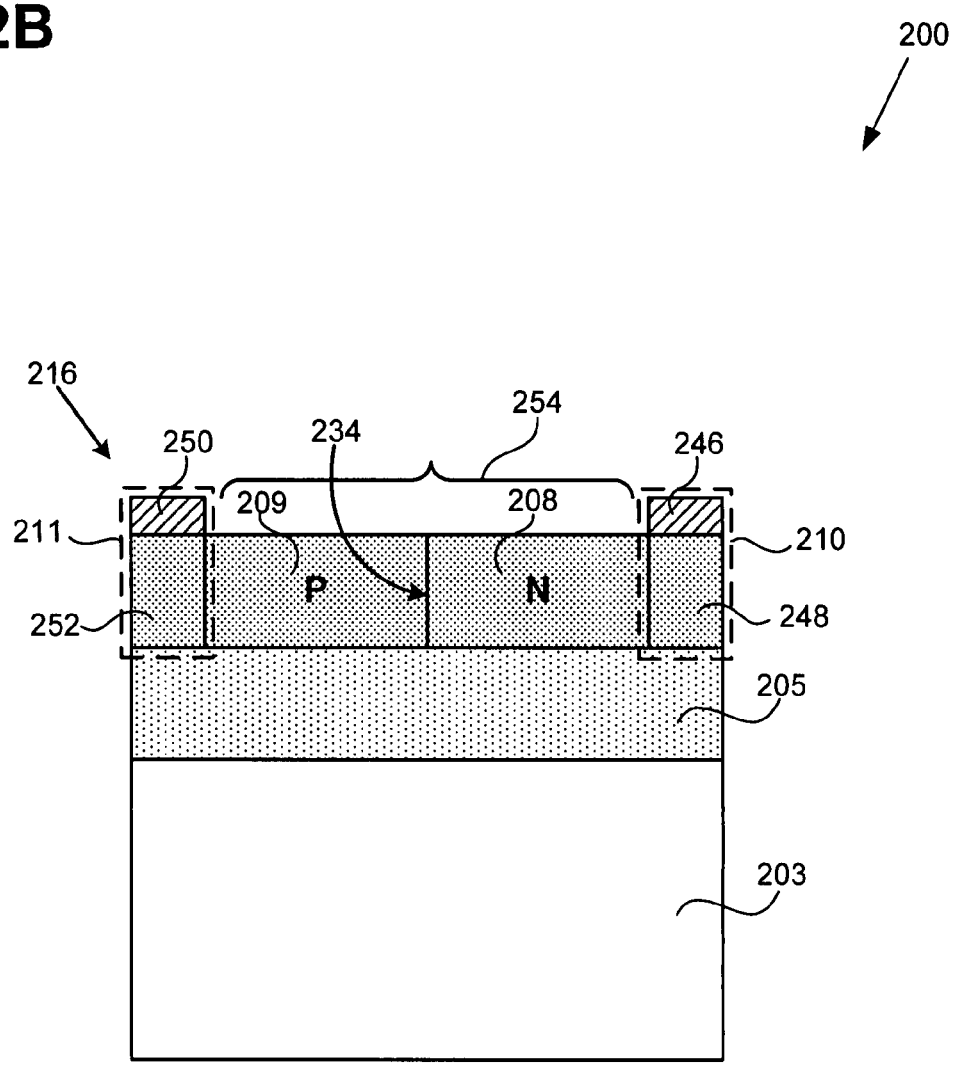
FIG. 2B illustrates a cross sectional view of an exemplary programmable poly fuse in FIG. 2A.

FIG. 2B shows a cross-sectional view of structure 200 in FIG. 2A along line 2B-2B in FIG. 2A. In particular, substrate 203, dielectric region 205, N type resistive poly segment 208, P type resistive poly segment 209, N side silicided poly line 210, P side silicide poly line 211, poly fuse 216, and interface 234 (forming the P-N junction polysilicon diode) correspond to the same elements in FIG. 2A and FIG. 2B. As shown in FIG. 2B, dielectric region 205 is situated on substrate 203 and N type resistive poly segment 208, P type resistive poly segment 209, N side silicided poly line 210, and P side silicide poly line 211 of poly fuse 216 are situated on dielectric region 205. Also shown in FIG. 2B, N side silicided poly line 210 comprises silicide segment 246 situated on polysilicon line 248 and P side silicided poly line 211 comprises silicide segment 250 situated on polysilicon line 252. Silicide segments 246 and 250 can be achieved using, for example, cobalt or nickel. Further shown in FIG. 2B, silicide is prevented from forming in region 254, which includes N type resistive poly segment 208 and P type resistive poly segment 209, by silicide blocking layer 207 (shown in FIG. 2A). As a result, a P-N junction forms between P type resistive poly segment 209 and N type resistive poly segment 208 at interface 234.

The operation of memory cell 204, which corresponds to memory cell 104 in memory array 100, will now be discussed in relation to FIGS. 1, 2A, and 2B. Prior to programming, a voltage of approximately 2.5 volts or less is applied to program node 224 of memory cell 204 and a ground voltage of approximately 0.0 volts is applied to ground node 230 of memory cell 204. As a result, the P-N junction, i.e., the diode, formed at interface 234 of poly fuse 216 in memory cell 204 is reverse-biased, which causes only a minimal reverse bias diode leakage current to flow between program node 224 and ground node 230 of memory cell 204. Thus, when poly fuse 216 is reverse-biased, a high reverse-biased resistance, e.g., a resistance greater than 10.0 mega ohms, is formed between read node 224 and ground node 230 of memory cell 204, which can define a logical state of "0" or "1."

To program memory cell 204, programming voltage 120, which should be higher than approximately 3.5 volts, is applied to programming node 224 using the programming device 110 so as to cause a reverse bias breakdown in the P-N junction formed in poly fuse 216 in memory cell 204. As a result, the state of the P-N junction in poly fuse 216 is changed so as to form a fuse resistance at interface 234, which can be, for example, less than approximately 10.0 ohms. The breakdown of the P-N junction in poly fuse 216 can occur through either avalanche or Zener breakdown as known in the art. Thus, as a result of the reverse bias breakdown in the P-N junction, the resistance at interface 234 of poly fuse 216 is reduced from a high reverse bias diode resistance of approximately 10.0 mega ohms or greater prior to programming to a fuse resistance of less than approximately 10.0 ohms after programming.

After memory cell 204 has been programmed, the resistance of poly fuse 216 is equal to the sum of the resistance of N type resistive poly segment 208 ($R_N$), the fuse resistance of the broken down P-N junction at interface 234 ($R_D$), and the resistance of P type resistive poly segment 209 ($R_P$), where $R_D$ is less than 10.0 ohms and $R_N+R_P$ is less than or equal to approximately 10.0 kilo ohms. Thus, after memory cell 204 has been programmed, the resistance between program node 224 and ground node 230, which is substantially equal to the resistance between N side terminal 212 and P side terminal 213 of poly fuse 216, is substantially equal to $R_N+R_P$, e.g., less than or equal to approximately 10.0 kilo ohms.

Thus, before memory cell 204 has been programmed, the resistance between program node 224 and ground node 230 of memory cell 204 is substantially equal to the reverse bias resistance of poly fuse 216, which can be, for example, greater than 10.0 mega ohms. After memory cell 204 has been programmed, i.e., after the P-N junction formed in poly fuse 216 has been broken down, the resistance between program node 224 and ground node 230 of memory cell 204 can be, for example, approximately equal to or less than 10.0 kilo ohms. Thus, before memory cell 204 has been programmed, the high reverse bias resistance between program and ground nodes 224 and 230 can define one logic state of memory cell 204 and the substantially lower resistance between program and ground nodes 224 and 230 that results after memory cell 204 has been programmed can define an opposite logic state.

To limit current flow between program node 224 and ground node 230 to an acceptable level after memory cell 216 has been programmed, i.e., after the P-N junction in poly diode fuse 216 has been broken down, the resistance of N type resistive poly segment 208 plus the resistance of P type resistive poly segment 209 can be selected to be, for example, approximately 10.0 kilo ohms.

In the present invention, once the P-N junction, i.e., the diode, formed at interface 234 between N type resistive poly segment 208 and P type resistive poly segment 209 of poly fuse 216 has been broken down during programming of memory cell 204, it (i.e. the P-N junction) is permanently broken down. As a result, the programmed state of memory cell 204 cannot change as a result of, for example, voltage or temperature stress. In contrast, in a conventional memory cell utilizing a conventional poly gate fuse, the poly gate fuse is programmed by causing a short to form in the gate oxide layer, thereby shorting the poly gate to the substrate, i.e., to ground. However, due to voltage or temperature stresses, the gate oxide layer may subsequently open up, thereby causing the conventional memory cell to change states, i.e., to change from a logic state of "1" to a logic state of "0," or vice versa. Thus, in contrast to a conventional memory cell utilizing a conventional poly gate fuse, the programmed state of the invention's memory cell cannot shift after it (i.e., the invention's memory cell) has been programmed.

Also, the programming voltage required to program a memory cell in the invention's memory array is significantly lower than the programming voltage that is typically required to program a memory cell that utilizes a conventional poly gate fuse in a conventional memory array. For example, a memory cell in the invention's memory array can require a programming voltage higher than approximately 3.5 volts, whereas a memory cell utilizing a conventional poly gate fuse in a conventional memory array can require a programming voltage of between 6.0 volts and 7.0 volts. By significantly reducing the high voltage required for memory cell programming, the invention correspondingly reduces the leakage current in charge pumps that are typically utilized to generate the programming voltage and in associated programming devices. As a result, the invention can achieve a memory array having a larger number of memory cells and, therefore, a greater bit storage capacity, compared to a conventional memory array that utilizes conventional poly gate fuses.

Moreover, a poly fuse utilized in a memory cell in the invention's memory array permanently breaks down once the programming voltage is increased to a voltage level that causes an avalanche or Zener breakdown process to initiate. As a result, a memory cell in the invention's memory array cannot change logic states once the memory cell has been programmed. In contrast, the gate oxide layer in a conventional poly gate fuse can change impedance as a result of voltage and temperature stresses that can occur subsequent to breakdown of the gate oxide layer. As a result, a memory cell utilizing a conventional poly gate fuse can change logic states after programming, which reduces the reliability of the memory cell and, consequently, the reliability of the conventional memory array. Thus, by utilizing poly diode fuses, such as poly fuse 216, in memory cells, the invention advantageously achieves a memory array, such as a programmable ROM array, having increased reliability compared to conventional memory array utilizing poly gate fuses in memory cells.

Figure 3:
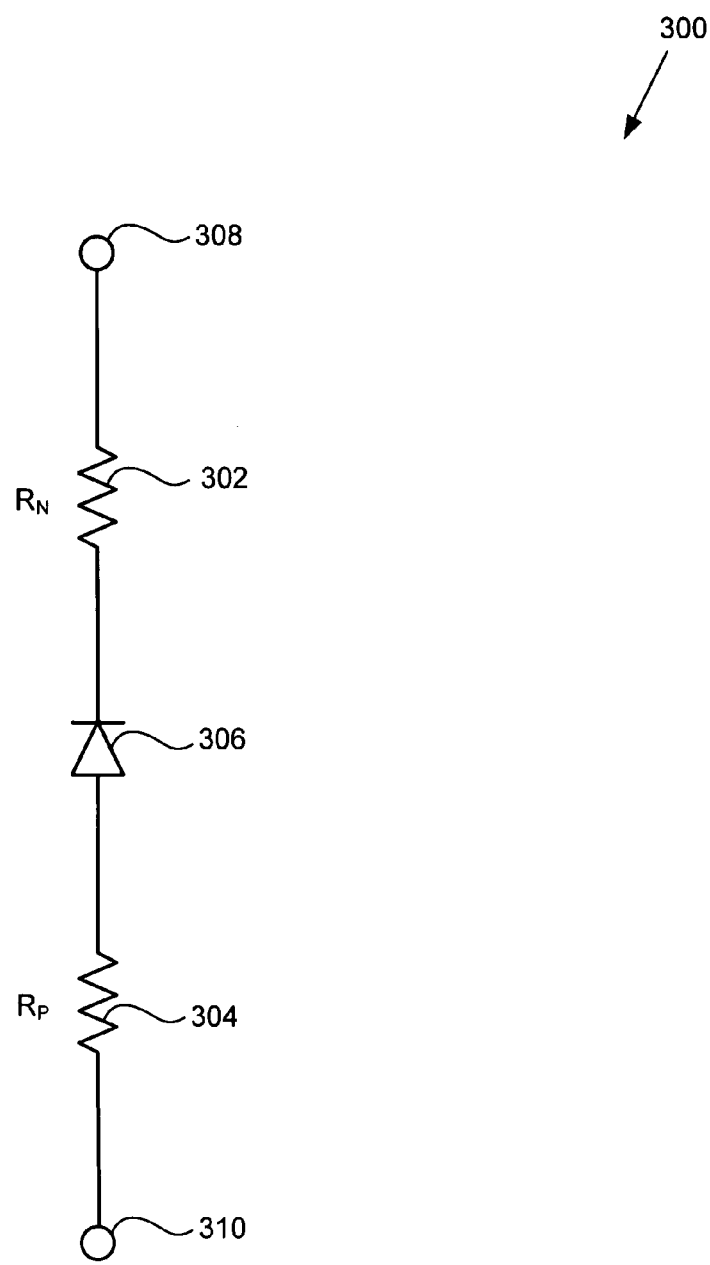
FIG. 3 illustrates a schematic diagram of an exemplary programmable poly fuse of FIGS. 2A and 2B, prior to programming of an associated memory cell in accordance with one embodiment of the present invention.

FIG. 3 shows a schematic diagram corresponding to poly fuse 216 in structure 200 of FIGS. 2A and 2B before memory cell 204 has been programmed. In diagram 300, resistor 302, diode 306, and resistor 304 correspond, respectively, to N type resistive poly segment 208, the P-N junction at interface 234, and P type resistive poly segment 209 of poly fuse 216 prior to programming of memory cell 204. Also in diagram 300, N side and P side terminals 308 and 310 correspond to respective N side and P side terminals 212 and 213 of poly fuse 216 in FIGS. 2A and 2B. As shown in FIG. 3, resistor 304, which has a resistance equal to $R_P$, diode 306, which has a reverse bias resistance equal to or greater than approximately 10.0 mega ohms, and resistor 302, which has a resistance equal to $R_N$, are connected in series between P side terminal 310 and N side terminal 308, where $R_N+R_P \leq 10.0$ kilo ohms, for example. Also, prior to programming of memory cell 204, diode 306, i.e., the P-N junction at interface 234 of poly fuse 216 is reverse biased. Thus, prior to programming, poly fuse 216 has a resistance that is substantially equal to the reverse bias resistance of diode 306, which can be, for example, approximately 10.0 mega ohms or greater.

Thus, the reverse bias resistance of poly fuse 216, which is essentially an open circuit, can be utilized to define a logic state of memory cell 204.

Figure 4:
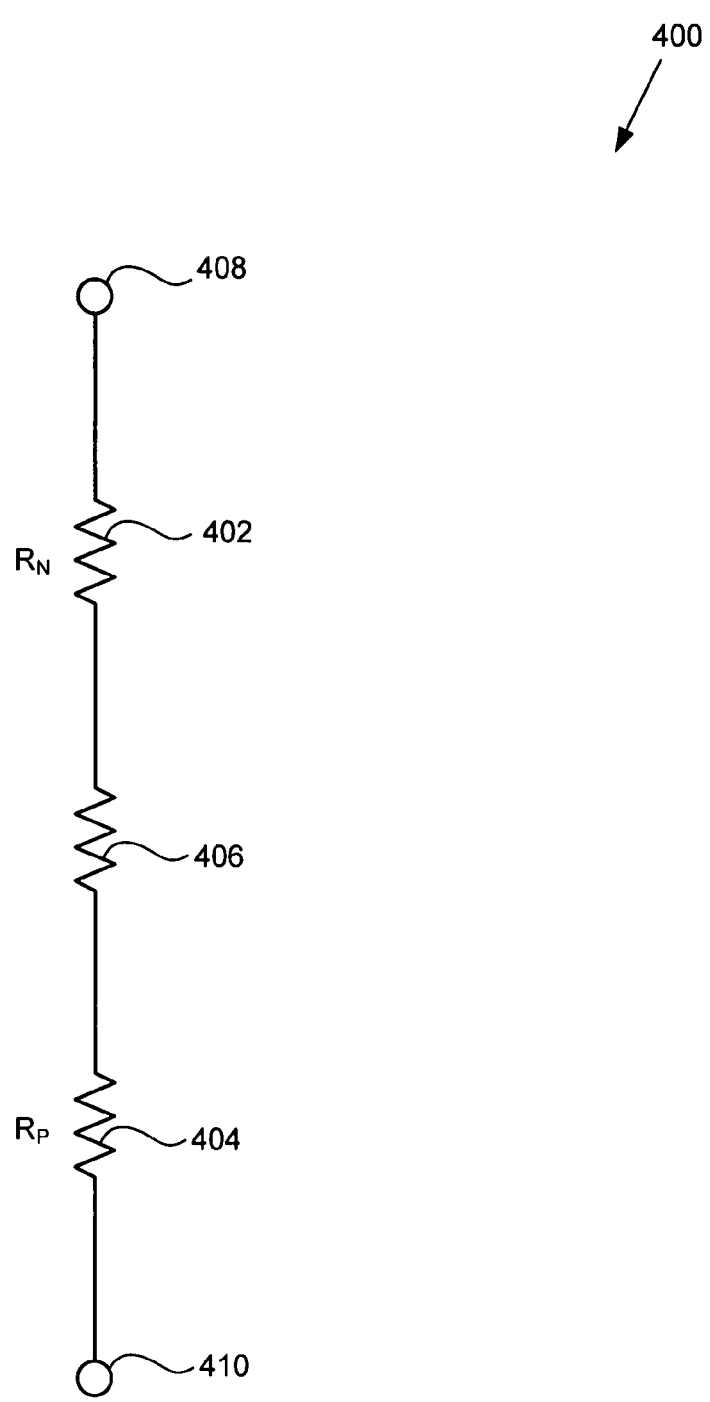
FIG. 4 illustrates a schematic diagram of an exemplary programmable poly fuse of FIGS. 2A and 2B, after programming of an associated memory cell in accordance with one embodiment of the present invention.

FIG. 4 shows a schematic diagram corresponding to poly fuse 216 in structure 200 of FIGS. 2A and 2B after memory cell 204 has been programmed. In diagram 400, resistors 402 and 404 and N side and P side terminals 408 and 410 correspond, respectively, to resistors 302 and 304 and N side and P side terminals 308 and 310 in diagram 300 in FIG. 3. After programming of memory cell 204, the P-N junction formed at interface 234, which is represented by diode 306 in diagram 300 in FIG. 3, can be represented by resistor 406 having a resistance equal to $R_D$, i.e., a fuse resistance, which can be, for example, less than approximately 10.0 ohms. Thus, after programming of memory cell 204, poly fuse 216 in FIGS. 2A and 2B can have a resistance equal to $R_N+R_D+R_P$, where $R_N$ and $R_P$ are each substantially greater than $R_D$. Thus, after programming, poly fuse 216 can have a resistance between N side terminal 408 and P side terminal 410 substantially equal to $R_N+R_D$, which can be, for example, approximately 10.0 kilo ohms or less. Thus, the relatively low resistance of poly fuse 216, which is essentially a short circuit compared to the high reverse bias resistance of poly fuse 216 prior to programming of memory cell 204, can be utilized to define a programmed logic state of memory cell 204.

Figure 5:
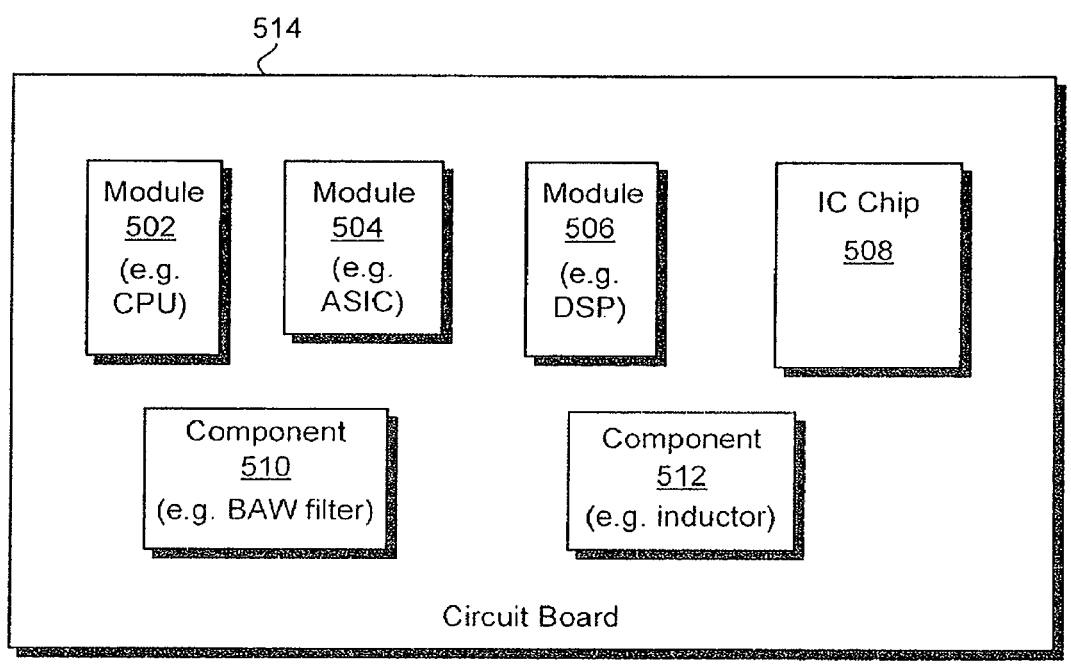
FIG. 5 illustrates a diagram of an exemplary electronic system including an exemplary chip or die including a memory array with a programmable poly fuse in each memory cell in accordance with one embodiment of the present invention.

FIG. 5 illustrates a diagram of an exemplary electronic system including an exemplary chip or die including a memory array in accordance with one embodiment of the present invention. Electronic system 500 includes exemplary modules 502, 504, and 506, IC chip or semiconductor die 508, discrete components 510 and 512, residing in and interconnected through circuit board 514. In one embodiment, electronic system 500 may include more than one circuit board. IC chip 508 can include an embodiment of the invention's memory array, such as memory array 100 in FIG. 1, as described above.

As shown in FIG. 5, modules 502, 504, and 506 are mounted on circuit board 514 and can each be, for example, a central processing unit (CPU), a graphics controller, a digital signal processor (DSP), an application specific integrated circuit (ASIC), a video processing module, an audio processing module, an RF receiver, an RF transmitter, an image sensor module, a power control module, an electro-mechanical motor control module, or a field programmable gate array (FPGA), or any other kind of module utilized in modern electronic circuit boards. Circuit board 514 can include a number of interconnect traces (not shown in FIG. 4) for interconnecting modules 502, 504, and 406, discrete components 510 and 512, and IC chip 508.

Also shown in FIG. 5, IC chip 508 is surface mounted on circuit board 514 and includes one or more of an embodiment of the invention's programmable poly fuses. In one embodiment, IC chip 508 may be mounted on a substrate in a semiconductor package, which can be in turn mounted on circuit board 514. In another embodiment, IC chip 508 may not be mounted on circuit board 514, and may be interconnected with other modules on different circuit boards. Further shown in FIG. 5, discrete components 510 and 512 are mounted on circuit board 514 and can each be, for example, a discrete filter, such as one including a BAW or SAW filter or the like, a power amplifier or an operational amplifier, a semiconductor device, such as a transistor or a diode or the like, an antenna element, an inductor, a capacitor, or a resistor.

Electronic system 500 can be utilized in, for example, a wired or wireless communications device, a cell phone, a switching device, a router, a repeater, a codec, a wired or wireless LAN, a WLAN, a Bluetooth enabled device, a digital camera, a digital audio player and/or recorder, a digital video player and/or recorder, a computer, a monitor, a television set, a satellite set top box, a cable modem, a digital automotive control system, a digitally-controlled home appliance, a printer, a copier, a digital audio or video receiver, an RF transceiver, a personal digital assistant (PDA), a digital game playing device, a digital testing and/or measuring equipment, a digital avionics device, a medical device, or a digitally-controlled medical equipment, or in any other kind of system, device, component or module utilized in modern electronics applications.

Thus, the present invention provides a memory array, such as a programmable ROM array, that includes a programmable poly fuse in each memory cell, where the programmable poly fuse is permanently broken down during programming. As a result, the invention achieves a memory array that includes memory cells that do not change logic states after programming. Thus, the invention advantageously achieves a memory array having greater reliability compared to a conventional memory array utilizing conventional poly gate fuses as memory cells.

Moreover, memory cells in the invention's memory array can be programmed at a significantly lower programming voltage compared to memory cells in conventional memory array that utilizes conventional poly gate fuses. By requiring a significantly lower programming voltage, the invention's memory array advantageously avoids problems typically caused by high memory cell programming voltage, such as increased leakage current in associated circuitry. As a result, the invention advantageously achieves a memory array, such as a programmable ROM array, that can have a larger number of memory cells and, therefore, a greater bit storage capacity, compared to a conventional memory array that utilizes conventional poly gate fuses.

Furthermore, the programmable poly fuses using polysilicon diodes presented in this invention can be packed closer together than conventional poly gate fuses. As a result, the present invention advantageously achieves a memory array, such as a programmable ROM array, having a higher bit density compared to a conventional memory array utilizing conventional poly gate fuses in memory cells.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, a memory array including programmable poly fuses has been described.

The invention claimed is:

1. A memory array comprising a memory cell having a programmable poly fuse coupled between a designated program node and a ground node, said programmable poly fuse comprising:

a P type resistive poly segment forming a P-N junction with an adjacent N type resistive poly segment;

said P type resistive poly segment being coupled to said ground node;

said N type resistive poly segment being coupled to said designated program node;

wherein silicide is prevented from forming on said P type resistive poly segment and said N type resistive poly segment, wherein said programmable poly fuse further comprises a P side silicided poly line contiguous with said P type resistive poly segment and coupled to said ground node.

2. The memory array of claim 1, wherein said programmable poly fuse further comprises an N side silicided poly line contiguous with said N type resistive poly segment and coupled to said designated program node.

3. The memory array of claim 1 further comprising a programming device selectably providing a programming voltage to said designated program node.

4. The memory array of claim 1, wherein said programmable poly fuse is situated over a shallow trench isolation region.

5. The memory array of claim 1, wherein said memory array resides in a semiconductor die.

6. The memory array of claim 1, wherein said memory array is a programmable ROM (read-only memory) array.

7. The memory array of claim 5, wherein said semiconductor die is utilized in a circuit board as a part of an electronic system, said electronic system being selected from the group consisting of a wired communications device, a wireless communications device, a cell phone, a switching device, a router, a repeater, a codec, a LAN, a WLAN, a Bluetooth enabled device, a digital camera, a digital audio player and/or recorder, a digital video player and/or recorder, a computer, a monitor, a television sets a satellite set top box, a cable modem, a digital automotive control system, a digitally-controlled home appliance, a printer, a copier, a digital audio or video receiver, an RF transceiver, a personal digital assistant (PDA), a digital game playing device, a digital testing and/or measuring device, a digital avionics device, a medical device, and a digitally-controlled medical equipment.

8. A method for programming a memory cell in a memory array, said memory cell comprising a poly fuse having a P type resistive poly segment forming a P-N junction with an adjacent N type resistive poly segment, said P type resistive poly segment being coupled to a ground node and said N type resistive poly segment being coupled to a designated program node of said memory cell, said method comprising:

causing a reverse bias breakdown in said P-N junction by applying a programming voltage to said designated program node, thereby changing a state of said P-N junction so as to form a fuse resistance smaller than a resistance of said N type resistive poly segment;

wherein silicide is prevented from forming on said P type resistive poly segment and said N type resistive poly segment, and wherein said N type resistive poly segment is coupled to said designated program node by an N side silicided poly line.

9. The method of claim 8, wherein said fuse resistance is less than a resistance of said P type resistive poly segment.

10. The method of claim 8, wherein said programming voltage is higher than approximately 3.5 volts.

11. The method of claim 8, wherein said P type resistive poly segment is coupled to said ground node by a P side silicided poly line.

12. The method of claim 8, wherein said memory array is a programmable ROM array.

13. A memory array comprising a memory cell having a programmable poly fuse coupled between a designated program node and a ground node, said memory array further comprising:

a programming device selectably providing a programming voltage to said designated program node;

said programmable poly fuse comprising P type resistive poly segment forming a P-N junction with an adjacent N type resistive poly segment;

said P type resistive poly segment being coupled to said ground node;

said N type resistive poly segment being coupled to said program node;

wherein silicide is prevented from forming on said P type resistive poly segment and said N type resistive poly segment, and wherein said programmable poly fuse further comprises a P side silicided poly line contiguous with said P type resistive poly segment and coupled to said ground node.

14. The memory array of claim 13, wherein said programmable poly fuse further comprises an N side silicided poly line contiguous with said N type resistive poly segment and coupled to said designated program node.

15. The memory array of claim 13, wherein said programming voltage is higher than approximately 3.5 volts.

16. The memory array of claim 13, wherein said programmable fuse is situated over a dielectric region, wherein said dielectric region is selected from the group consisting of a field oxide region and a shallow trench isolation region.

17. The memory array of claim 13, wherein said memory array is a programmable ROM array.

* * * * *